US007123724B1

(12) United States Patent
Pfaffinger et al.

(10) Patent No.: US 7,123,724 B1
(45) Date of Patent: Oct. 17, 2006

(54) SOUND SYSTEM

(76) Inventors: Gerhard Pfaffinger, Sedanstrasse 19, D-93055 Regensburg (DE); Franz Lorenz, Nepomukplatz 2, D-94345 Obermotzig (DE); Markus Christoph, Danziger Strasse 46, D-94315 Straubing (DE)

(*) Notice: Subject to any disclaimer, the term of this patent is extended or adjusted under 35 U.S.C. 154(b) by 1074 days.

(21) Appl. No.: 09/721,428

(22) Filed: Nov. 22, 2000

(30) Foreign Application Priority Data

Nov. 25, 1999 (DE) ................................ 199 56 690

(51) Int. Cl.
*H04R 5/00* (2006.01)
*H04R 1/40* (2006.01)
*H03G 5/00* (2006.01)
*H03G 9/00* (2006.01)

(52) U.S. Cl. ............................. 381/1; 381/18; 381/97; 381/98; 381/102

(58) Field of Classification Search .................. 381/59, 381/97, 61, 89, 307, 104–107, 1
See application file for complete search history.

(56) References Cited

U.S. PATENT DOCUMENTS 3,757,046 A * 9/1973 Williams .................... 381/307
5,109,415 A * 4/1992 Ishida ........................... 381/1
5,305,386 A 4/1994 Yamato
5,325,435 A * 6/1994 Date et al. ...................... 381/1
5,657,391 A * 8/1997 Jyosako ......................... 381/1
5,793,876 A * 8/1998 Derogis et al. ............... 381/89
5,889,867 A 3/1999 Bauck ........................... 381/1

FOREIGN PATENT DOCUMENTS

| | | |
|---|---|---|
| JP | 02-241 296 A | 9/1990 |
| JP | 04-337 999 A | 11/1992 |
| JP | 06-315 198 A | 11/1994 |
| JP | 07-046 698 A | 2/1995 |
| WO | WO 97 30 566 A1 | 8/1997 |
| WO | WO 98/54926 | 12/1998 |

OTHER PUBLICATIONS

Patent Abstracts of Japan, JP H01-151399 A, Jun. 14, 1989.
Patent Abstracts of Japan, JP H06-315198 A, Nov. 8, 1994.
Patent Abstracts of Japan, JP S55-085200 A, Jun. 26, 1980.

* cited by examiner

*Primary Examiner*—Laura A. Grier
(74) *Attorney, Agent, or Firm*—Foley Hoag LLP

(57) ABSTRACT

The invention is directed to a sound system with four loudspeakers and at least one signal processing device connected to the input of two loudspeakers and controlled by two input signals. The signal processing device produces control signals for the loudspeakers. The respective control signals are equal to the sum of the input signals which are weighted differently with respect to amplitude and phase, so that the radiation characteristic of the two loudspeakers depends on the weighting of the input signals.

15 Claims, 2 Drawing Sheets

SOUND SYSTEM

FIELD OF THE INVENTION

The invention relates to a sound system with four loudspeakers and more particularly to a sound system with an adjustable radiation pattern.

BACKGROUND OF THE INVENTION

A loudspeaker typically has a constant radiation characteristic. The radiation characteristic of loudspeakers incorporated into sound systems can be changed to a limited degree by suitable placement of the loudspeakers in the auditorium and/or with the help of additional mechanical devices, such as acoustic reflectors or acoustic lenses. Sound systems in automobiles are subject to particularly stringent requirements since neither can the location for installation of the loudspeakers in general be arbitrarily selected, nor is there enough available space for installing additional mechanical devices. Moreover, since the space into which the sound is radiated is typically relatively small, the channels of, for example, stereo sound can frequently not be adequately separated, in particular for more than one listener.

JP 07-046 698 A discloses a circuit with left and right audio signal channels, with each channel having an adder unit which admixes to the original audio channel signal a phase-shifted portion of the sound signal from the opposite channel with a modified amplitude (cross-coupling).

JP 06-315 198 A discloses a similar circuit with an additional control unit for adjusting the amplifiers and phase shifters in the cross-coupling branches. The reference shows loudspeakers connected to the outputs. Hence, JP 06-315 198 A shows an arrangement where respective sums are formed from input signals that have differently weighted amplitudes and phases.

JP 04-337 999 A discloses a device with several loudspeakers controlled by phase shifters, wherein the radiation direction of the loudspeakers can be altered using the phase shifters.

U.S. Pat. No. 5,305,386 A, in particular FIG. 4 (2), discloses a circuit with cross-coupled branches that include attenuation units and phase shifters. This circuit forms part of an overall circuitry for expanding and controlling tonal responses ("sound fields").

WO 97 30 566 A1 is also directed to imaging virtual sound sources at predetermined locations by taking also into consideration the radiation angle enclosed by the loudspeakers (e.g., 10 degrees). For this purpose, filter circuits H1(*z*) and H2(*z*) which introduce phase shifts, are provided in both the main branches and the cross-coupled branches.

JP 02-241 296 A discloses an arrangement with four loudspeakers which are placed in an automobile in front of the driver and the passenger. The loudspeakers operate so that the driver as well as the passenger can perceive a usable stereo tonal response. However, this arrangement includes neither phase shifters nor cross couplers.

It would therefore be desirable to provide a sound system wherein the radiation characteristic can be changed without requiring adjustments in the position of the loudspeakers and without employing additional mechanical devices.

SUMMARY OF THE INVENTION

The invention is directed to a system wherein the radiation characteristic can be changed electronically. The system requires relatively little space, does not have to be located in the vicinity of the loudspeakers and can be mass-produced.

According to an aspect of the invention, a sound system includes four loudspeakers and at least one signal processing device that is connected before two of the loudspeakers and controlled by two input signals. The signal processing device produces control signals for the respective two loudspeakers. The control signals are equal to the sum of the input signals, with the amplitude and phase of the input signals being weighted differently. The radiation characteristic of the respective two loudspeakers depends on the weighting of the input signals. The signal processing device can be implemented in analog and/or digital circuitry. The desired radiation characteristic can hence be adjusted by changing the phases and/or the attenuation/amplification.

Advantageously, the signal processing device includes two adder units. One of the input signals is supplied to one input of the adder unit via a first phase shifter and a first coefficient unit, whereas the other input signal is supplied to the other input of the adder unit via a second phase shifter and a second coefficient unit. In this way, the phases and amplitudes can be adjusted easily and separately.

In particular with stereophonic input signals, the first and second phase shifters each have an identical phase shift, and the first and second coefficient units each have an identical attenuation/amplification.

According to another embodiment of the invention, phase shifters can be used that produce frequency-independent phase shifts. Suitable phase shifters therefor are in particular so-called Hilbert transformers which produce a frequency-independent phase shift of 90 degrees. Preferably, however, the phase shifts are adjustable. The signal can be phase-shifted by 90 degrees and then mixed with the original signal in a suitable manner so as to produce a signal with a constant amplitude and an arbitrary phase shift. In this way, the phase shift can be easily adjusted without causing the control signal to change the frequency characteristic of the individual loudspeaker. Alternatively, phase shifters can be employed that provide a frequency-independent phase shift only over a predetermined frequency range, while a frequency shift can be tolerated in other frequency ranges. In other situations, a certain frequency dependence of the control signal may be desirable to compensate, for example, for deficits in the frequency characteristic of loudspeaker. In this case, appropriately designed analog and/or digital filters can be used as phase shifters.

According to another embodiment of the invention, a first pair of the four loudspeakers is arranged between the other pair of the loudspeakers, with the main radiation directions of the first pair of loudspeakers being adjusted at a predetermined angle with respect to a perpendicular direction away from each other in a direction towards the other pair of loudspeakers. Preferably, the main radiation directions of the other pair of loudspeakers are aligned at a certain angle to the perpendicular direction in a direction towards the first pair of loudspeakers. Alternatively, the first pair of loudspeakers can also been arranged next to the other pair of loudspeakers, wherein the main radiation directions of the first pair of loudspeakers and the other pair of loudspeakers are adjusted towards each other at a predetermined angle with respect to the perpendicular direction. In this way, the sound can be optimally adapted for two listeners.

According to another embodiment of the invention, an additional signal processing device can be connected before the other pair of loudspeakers, whereby the radiation characteristic of the other pair of loudspeakers can be easily adjusted.

Further features and advantages of the present invention will be apparent from the following description of preferred embodiments and from the claims.

BRIEF DESCRIPTION OF THE DRAWINGS

The following figures depict certain illustrative embodiments of the invention in which like reference numerals refer to like elements. These depicted embodiments are to be understood as illustrative of the invention and not as limiting in any way.

DETAILED DESCRIPTION OF CERTAIN ILLUSTRATED EMBODIMENTS

Figure 1:
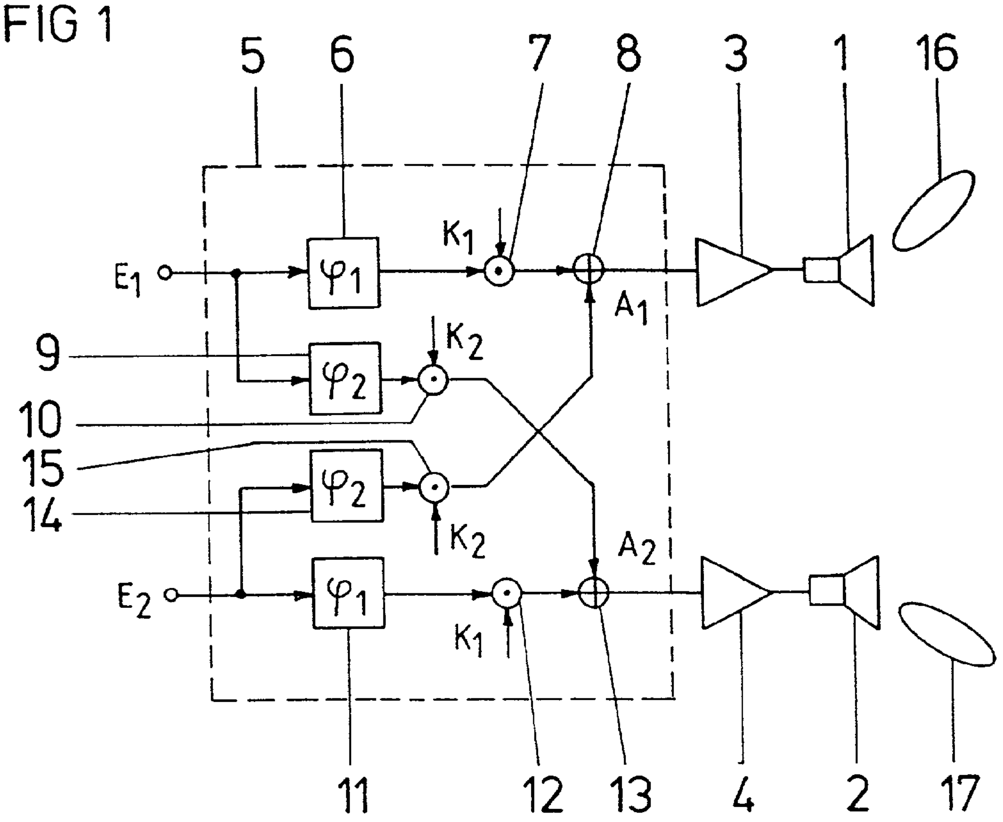
FIG. 1 shows a first embodiment of a signal processing device for a sound system of the invention.

Referring first to FIG. 1, an exemplary signal processing device 5 includes two loudspeakers 1 and 2, wherein each of the two loudspeakers 1, 2 is controlled by one of two stereophonic input signals $E_1$, $E_2$, with respective power amplifiers 3, 4 connected between the loudspeakers and the input signals. A signal processing device 5, which receives the input signals $E_1$, $E_2$, is connected before the power amplifiers 3, 4. In the signal processing device 5, the input signal $E_1$ is supplied to an adder unit 8 via a phase shifter 6 with a frequency-independent phase shift $\phi_1$ and via a coefficient unit 7 with a coefficient $K_1$ representing a damping or amplification. The adder unit 8 also receives the input signal $E_2$ from a phase shifter 14 with a frequency-independent phase shift $\phi_2$ and a coefficient unit 10 with a coefficient $K_2$ representing a damping or amplification. The adder unit 8 produces from the supplied input signals a control signal $A_1$ for the power amplifier 3. Likewise, the input signal $E_2$ is supplied to an adder unit 13 via a phase shifter 11 with a frequency-independent phase shift $\phi_1$ and via a coefficient unit 12 with a coefficient $K_1$. The adder unit 13 also receives the input signal $E_1$ from a phase shifter 9 with a frequency-independent phase shift $\phi_2$ and a coefficient unit 10 with a coefficient $K_2$ representing a damping or amplification and produces therefrom a control signal $A_2$ for the power amplifier 4.

Each of the input signals $E_1$ and $E_2$ is hence supplied to two phase shifters 6, 9 and 11, 14, respectively, that produce the phase shifts $\phi_1$ and $\phi 2$. The phase-shifted input signals $E_1$ and $E_2$ are then weighted with the weighing coefficients $K_1$ *and* $K_2$ and subsequently added "crosswise" to produce the control signals $A_1$ and $A_2$. The relationship between $A_1$ and $A_2$ as a function of $E_1$ and $E_2$, $K_1$ and $K_1$, +1 and +2 can be expressed by the following formulas:

$$A_1=K_1*E_1(+1)+K_2*E_2(+_2)$$

$$A_2=K_1*E_2(+_1)+K_2*E_1(+_2)$$

As indicated in FIG. 1 by two lobes 16, 17, the main radiation direction of the two loudspeakers 1, 2 shifts due to the phase relationship between the two control signals $A_1$ and $A_2$, the relative separation between the two loudspeakers 1, 2 as well as the distance between the listener and the loudspeakers 1, 2. Several of the parameters that determine the main radiation direction are predetermined. For example, the separation between the two loudspeakers is determined by the fixed mounting location of loudspeakers 1, 2 in a vehicle, and the fixed distance of the listener from the loudspeakers 1, 2 is determined by the essentially fixed position of the listener. Consequently, assuming a constant sound volume, the phase shifts $\phi_1$ and $\phi_2$ are typically the preferred parameters for adjusting the azimuth of the main radiation directions.

Figure 2:
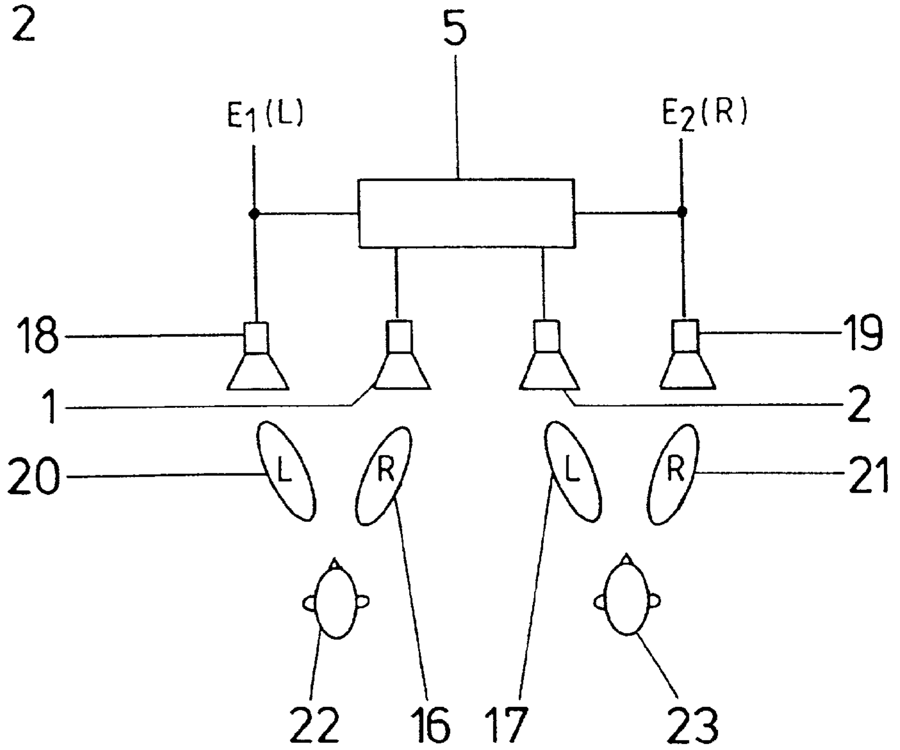
FIG. 2 shows another embodiment of the sound system of the invention.

In the embodiment of FIG. 2, two additional loudspeakers 18, 19 are provided in addition to the loudspeakers 1, 2 that are connected to the signal processing device 5 of FIG. 1. The loudspeakers 18, 19 are controlled directly by the input signals $E_1$ and $E_2$, with the input signal $E_1$ forming the left channel L and the input signal $E_2$ forming the right channel R of a stereophonic signal. The additional loudspeakers 18, 19 are arranged to the left and to the right of the loudspeakers 1, 2 in such a way that the lobes 20, 21 of the main radiation directions are oriented inwardly towards the loudspeakers 1, 2. The lobes 16 and 17 of the loudspeakers 1, 2, on the other hand, are oriented outwardly and away from one another. This produces for each of two listeners 22 and 23 an unperturbed stereophonic perception, with the loudspeakers 2, 18 reproducing the left channel L and the loudspeakers 1, 19 reproducing the right channel R. The loudspeakers 1, 18 radiate towards the listener 22, and the loudspeakers 2, 19 radiate towards the listener 23. In this embodiment, it is assumed that the loudspeakers 18, 19 can be installed at a suitable location so as to produce the desired radiation characteristic.

Figure 3:
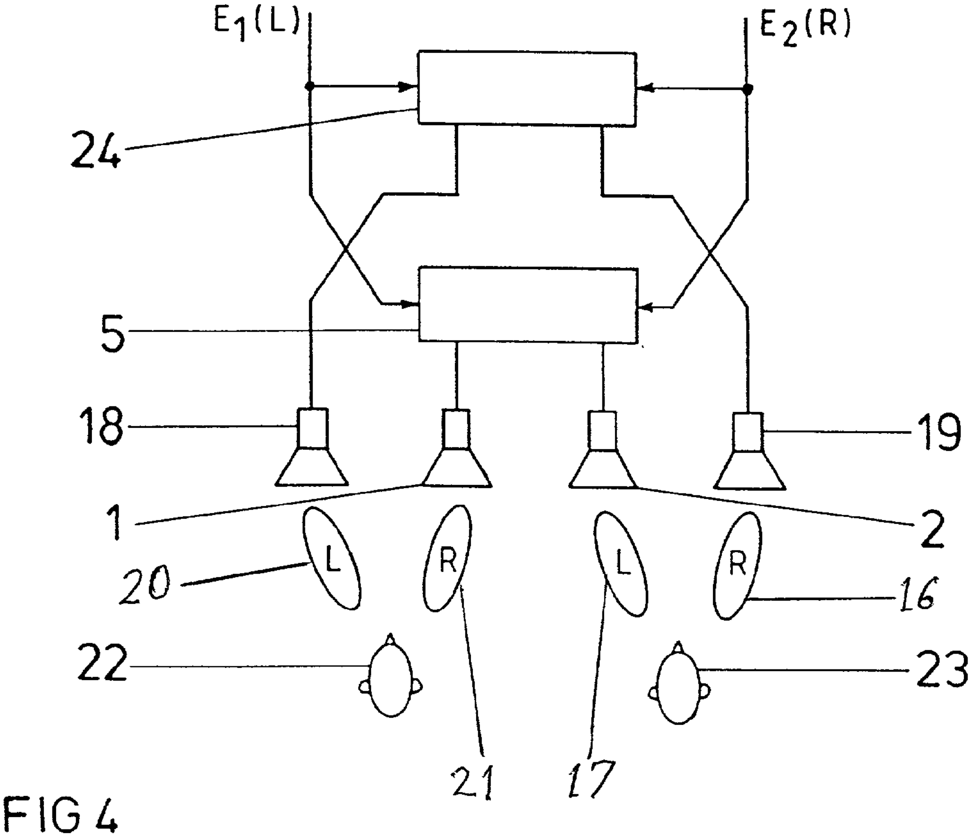
FIG. 3 shows an alternative embodiment of the sound system of FIG. 2.

If this is not possible, then the arrangement of FIG. 2 can be modified, as a depicted in FIG. 3. Here, a signal processing device 24 which can be constructed in a similar manner as the signal processing device 5, is connected before the loudspeakers 18, 19, and the radiation characteristic is adjusted so that the lobes 20 and 21 point more inwardly.

Figure 4:
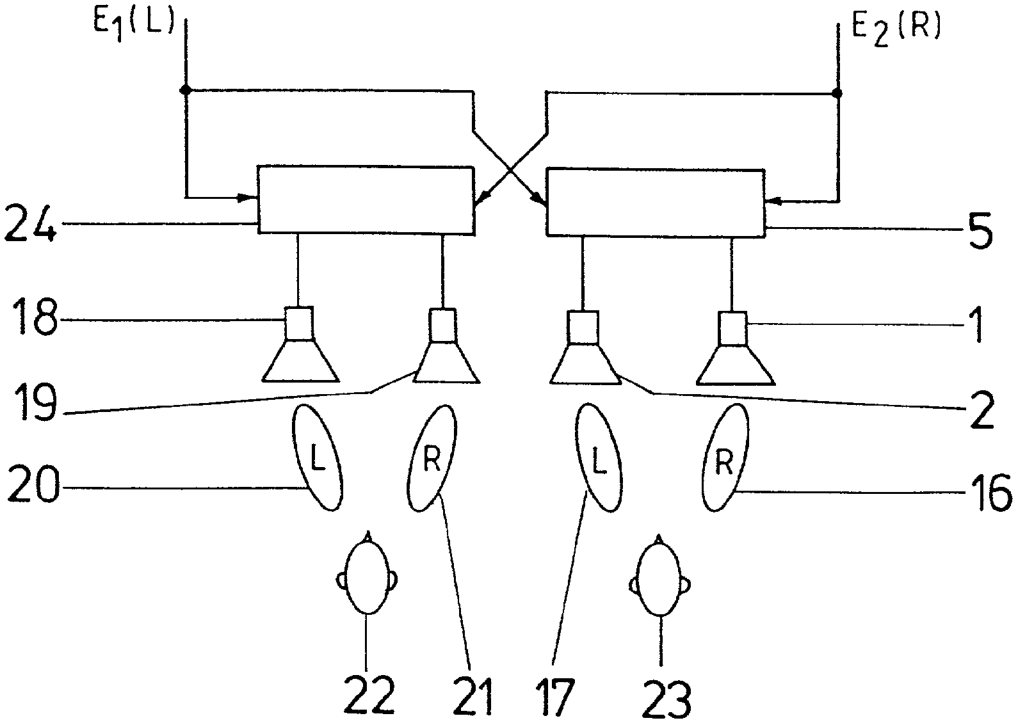
FIG. 4 shows another alternative embodiment of the sound system of FIG. 2.

The radiation characteristic can be adapted to each listener individually by modifying the arrangement of FIG. 3, as depicted in FIG. 4. The loudspeakers 1, 2, and 18, 19, respectively, located next to one another are here arranged in pairs. In this case, the loudspeakers 1, 2 radiate sound towards the listener 23, whereas the loudspeakers 18, 19 radiate sound towards the listener 22. The lobes 20, 21 and 16, 17, respectively, are thereby tilted towards one another.

While the invention has been disclosed in connection with the preferred embodiments shown and described in detail, various modifications and improvements thereon will become readily apparent to those skilled in the art. For example, more than two pairs of loudspeakers can be provided, with each pair controlled by a respective signal processing device in the same manner as described above for at least one pair. Accordingly, the spirit and scope of the present invention is to be limited only by the following claims.

We claim:

1. A sound system comprising:

at least two loudspeakers forming a first pair, and at least one signal processing device, wherein the at least one signal processing device is controlled by two input signals and produces respective control signals that are applied to at least two of the loudspeakers, and wherein the signal processing device phase-shifts the input signals independently of frequency over at least a portion of a frequency range and weights the input signals differently with respect to amplitude and phase, and the control signals it produces are equal to respective sums of the input signals thus weighted, so that a radiation characteristic of the pair of loudspeakers depends on the weighting of the input signals.

2. Sound system according to claim 1, wherein the at least one signal processing device includes:

first and second adder units, each adder unit having first and second inputs and an output connected to one loudspeaker of the pair of loudspeakers, at least two first phase shifters and at least two first coefficient units, with a respective first phase shifter connected in series with a respective first coefficient unit, and at least two second phase shifters and at least two second coefficient units, with a respective second phase shifter connected in series with a respective second coefficient unit, wherein a first of the two input signals is supplied to the first input of the first adder unit through a first phase shifter and a first coefficient unit and to the second input of the second adder unit through a second phase shifter and a second coefficient unit, and wherein the other input signal is supplied to the first input of the second adder unit through another first phase shifter and another first coefficient unit and to the second input of the first adder unit through another second phase shifter and another second coefficient unit.

3. Sound system according to claim 2, wherein each of the first phase shifters and each of the second phase shifters have respective identical phase shifts, and wherein each of the first coefficient units and each of the second coefficient units each have respective identical attenuation/amplification coefficients.

4. Sound system according to claim 2, wherein the first and second phase shifters produce frequency-independent phase shifts.

5. Sound system according to claim 1, wherein the phase can be shifted and the phase shift is adjustable.

6. Sound system according to claim 1, further comprising two additional loudspeakers forming a second pair, wherein the first pair of loudspeakers is arranged between the second pair of loudspeakers and a main radiation direction of a loudspeaker of the first pair is adjusted so as to point away from a main radiation direction of the other loudspeaker of the first pair towards a respective loudspeaker of the second pair of loudspeakers at a predetermined angle with respect to a direction perpendicular to an imaginary line connecting the four loudspeakers.

7. Sound system according to claim 6, wherein a main radiation direction of a loudspeaker of the second pair of loudspeakers is oriented in a direction towards the first pair of loudspeakers at a predetermined angle with respect to the perpendicular direction.

8. Sound system according to claim 1, further comprising two additional loudspeakers forming a second pair, wherein the first pair of loudspeakers is arranged next to the second pair of loudspeakers, and a main radiation direction of a loudspeaker of the first pair is adjusted so as to point towards a main radiation direction of the other loudspeaker of the first pair at a predetermined angle with respect to a direction perpendicular to an imaginary line connecting the four loudspeakers, and a main radiation direction of a loudspeaker of the second pair is adjusted so as to point towards a main radiation direction of the other loudspeaker of the second pair at a predetermined angle with respect to the perpendicular direction.

9. Sound system according to claim 1, further comprising two additional loudspeakers and an additional signal processing device which produces control signals that are applied to at least the two additional loudspeakers.

10. A sound system comprising:

a plurality of loudspeakers, with at least several of the loudspeakers arranged in pairs, and at least one signal processing device, wherein the at least one signal processing device is controlled by two input signals and produces respective control signals that are applied to at least one pair of loudspeakers, wherein the signal processing device phase-shifts the input signals independently of frequency over at least a portion of a frequency range and weights input signals differently with respect to amplitude and phase, and the control signals it produces are equal to respective sums of the input signals thus weighted, so that a radiation characteristic of the at least one pair of loudspeakers depends on the weighting of the input signals.

11. A method of producing a sound pattern, comprising:

providing at least four loudspeakers associated in pairs, processing stereophonic input signals to produce weighted input signals by adjusting an amplitude and a phase of respective channels of the stereophonic input signals, wherein the phase is adjusted independent of a sound frequency over at least a portion of a frequency range, and adding the weighted input signals to produce control signals for respective pairs of the loudspeakers, wherein a radiation characteristic of the pair of loudspeakers depends on the weighting of the input signals.

12. The method of claim 11, wherein the phase is adjusted so as to be independent of the sound frequency over the entire frequency range of the sound frequency.

13. A sound system comprising:

at least two loudspeakers forming a first pair, at least two additional loudspeakers forming a second pair, and at least one signal processing device, wherein the first pair of loudspeakers is arranged between the second pair of loudspeakers and a main radiation direction of a loudspeaker of the first pair is adjusted so as to point away from a main radiation direction of the other loudspeaker of the first pair towards a respective loudspeaker of the second pair of loudspeakers at a predetermined angle with respect to a direction perpendicular to an imaginary line connecting the four loudspeakers, wherein the at least one signal processing device is controlled by two input signals and produces respective control signals that are applied to at least two of the loudspeakers, and wherein the signal processing device weights the input signals differently with respect to amplitude and phase, and the control signals it produces are equal to respective sums of the input signals thus weighted, so that a radiation characteristic of the pair of loudspeakers depends on the weighting of the input signals.

14. The sound system of claim 13, wherein a main radiation direction of a loudspeaker of the second pair of loudspeakers is oriented in a direction towards the first pair of loudspeakers at a predetermined angle with respect to the perpendicular direction.

15. A sound system comprising:

at least two loudspeakers forming a first pair, at least two additional loudspeakers forming a second pair, and at least one signal processing device, wherein the first pair of loudspeakers is arranged next to the second pair of loudspeakers, and a main radiation direction of a loudspeaker of the first pair is adjusted so as to point towards a main radiation direction of the other loudspeaker of the first pair at a predetermined angle with respect to a direction perpendicular to an imaginary line connecting the four loudspeakers, and a main radiation direction of a loudspeaker of the second pair is adjusted so as to point towards a main radiation direction of the other loudspeaker of the second pair at a predetermined angle with respect to the perpendicular direction, wherein the at least one signal processing device is controlled by two input signals and produces respective control signals that are applied to at least two of the loudspeakers, and wherein the signal processing device weights the input signals differently with respect to amplitude and phase, and the control signals it produces are equal to respective sums of the input signals thus weighted, so that a radiation characteristic of the pair of loudspeakers depends on the weighting of the input signals.

* * * * *